US008413092B2

United States Patent
Nonaka

(10) Patent No.: US 8,413,092 B2
(45) Date of Patent: Apr. 2, 2013

(54) CIRCUIT DESIGN SUPPORTING APPARATUS AND CIRCUIT DESIGN SUPPORTING METHOD

(75) Inventor: Junpei Nonaka, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 400 days.

(21) Appl. No.: 12/659,340

(22) Filed: Mar. 4, 2010

(65) Prior Publication Data
US 2010/0229138 A1 Sep. 9, 2010

(30) Foreign Application Priority Data

Mar. 5, 2009 (JP) ................................ 2009-052261

(51) Int. Cl.
*G06F 17/50* (2006.01)
(52) U.S. Cl. ........ 716/108; 716/103; 716/106; 716/107; 716/113; 716/134; 716/136
(58) Field of Classification Search .......... 716/100–113, 716/134–136
See application file for complete search history.

(56) References Cited

U.S. PATENT DOCUMENTS

| 5,570,376 | A  | * | 10/1996 | Kunda et al. .................. 714/736 |
| 5,619,418 | A  | * | 4/1997  | Blaauw et al. ................ 716/113 |
| 7,600,203 | B2 |   | 10/2009 | Nonaka |
| 2002/0124230 | A1 | * | 9/2002 | Cai et al. ........................... 716/6 |
| 2003/0177460 | A1 | * | 9/2003 | Chen ................................. 716/5 |
| 2003/0217315 | A1 | * | 11/2003 | Maamari et al. .............. 714/741 |
| 2005/0155001 | A1 | * | 7/2005 | Kinoshita et al. ................. 716/2 |
| 2006/0259880 | A1 | * | 11/2006 | Dood et al. ........................ 716/2 |
| 2006/0282726 | A1 |   | 12/2006 | Katsuzawa |
| 2007/0180415 | A1 | * | 8/2007 | Pundoor ............................ 716/6 |
| 2009/0210764 | A1 | * | 8/2009 | Nozuyama ..................... 714/737 |
| 2010/0050140 | A1 | * | 2/2010 | Chang et al. ....................... 716/6 |

FOREIGN PATENT DOCUMENTS

| JP | 2006-133122 A | 5/2006 |
| JP | 2006-324443 A | 11/2006 |
| JP | 2007-122422 A | 5/2007 |

OTHER PUBLICATIONS

Irith Pomeranz, Srikanth Venkataraman and Sudhakar M. Reddy, "Z-DFD: Design-For-Diagnosability Based on the Concept of Z-Detection (International Test Conference, 2004, Proceedings)," Nov. 2004, pp. 489-497.
Japanese Office Action dated Nov. 26, 2012 with an English translation.

* cited by examiner

*Primary Examiner* — Paul Dinh
(74) *Attorney, Agent, or Firm* — McGinn IP Law Group, PLLC

(57) ABSTRACT

A circuit design supporting apparatus includes: an observation portion specifying section configured to specify a first portion with a high improvement effect of analysis easiness in failure analysis of an integrated circuit as an observation portion; and an element substitution performing section configured to substitute an element arranged in the observation portion by an analysis target element to which a failure analysis apparatus can appropriately conduct the failure analysis based on a data of the observation portion. The element substitution performing section includes a timing analyzing section configured to perform timing analysis of the integrated circuit shown by a netlist; a delay calculating section configured to calculate a delay in the integrated circuit based on a result of the timing analysis by said timing analyzing section and said netlist; a substitution element determining section configured to specify a fine element, which is arranged in said observation portion, of elements of the integrated circuit as a substitution candidate element; and an element substituting section configured to update said netlist to form a new netlist.

26 Claims, 16 Drawing Sheets

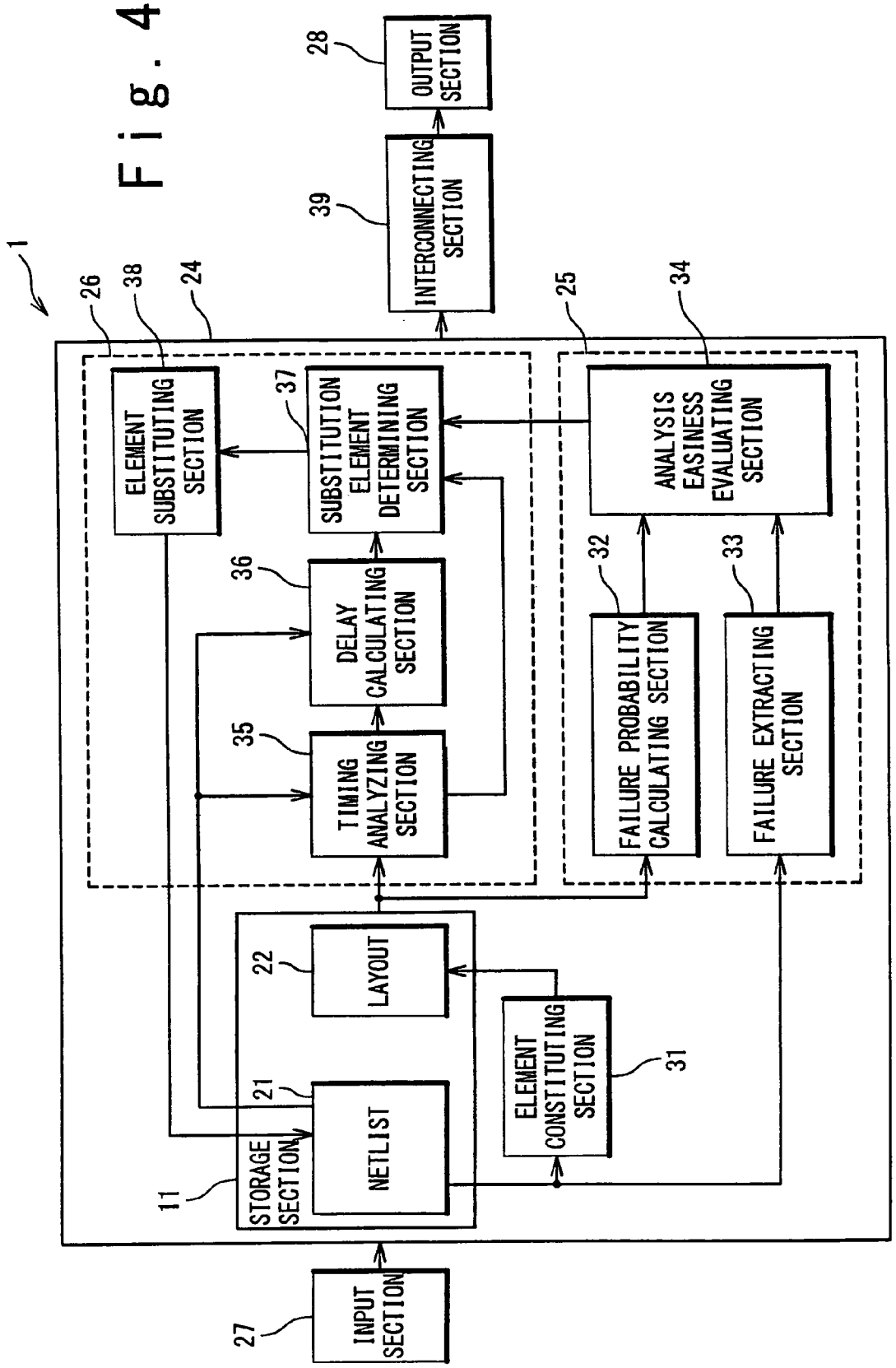

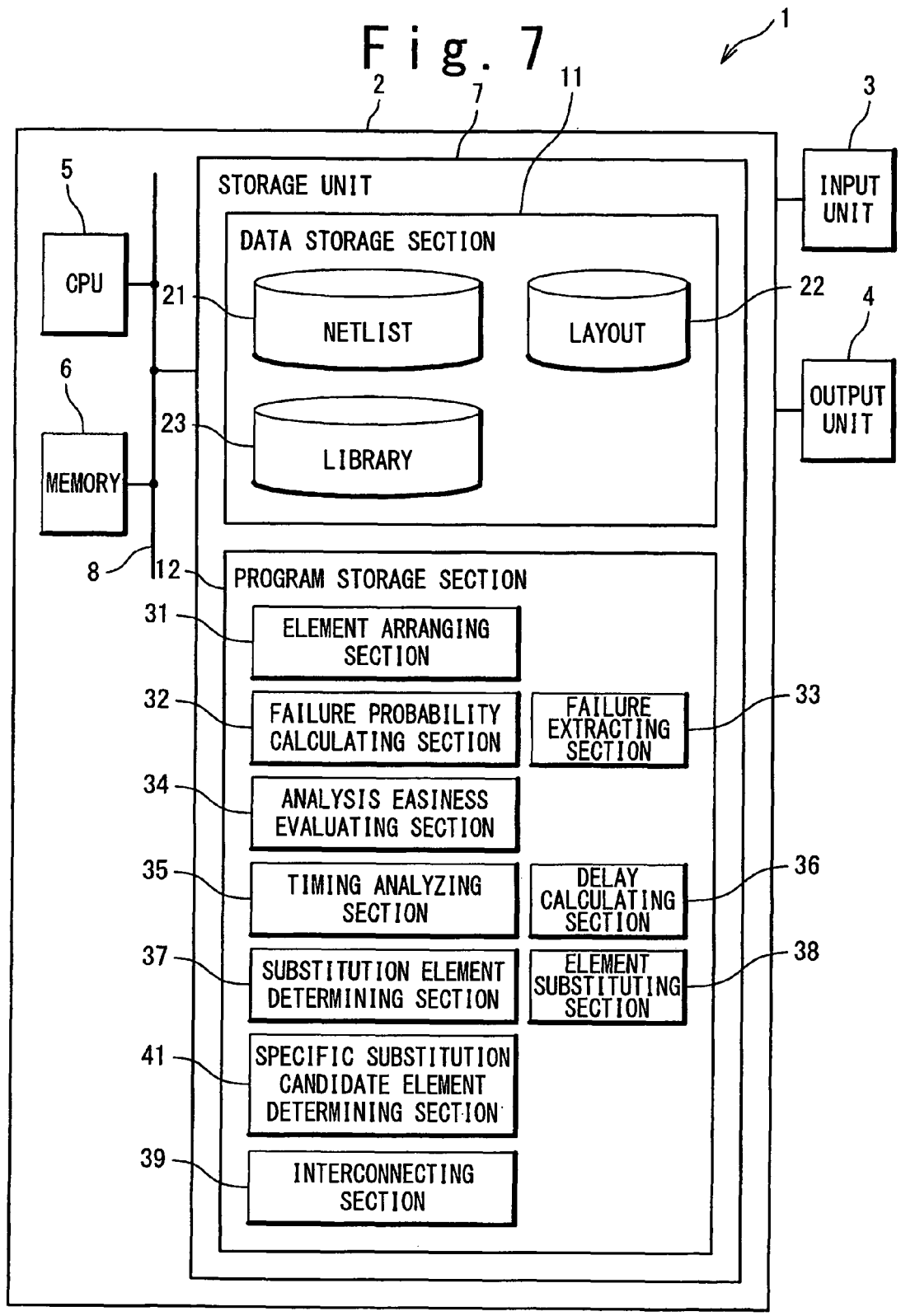

CIRCUIT DESIGN SUPPORTING APPARATUS AND CIRCUIT DESIGN SUPPORTING METHOD

INCORPORATION BY REFERENCE

This application claims a priority on convention based on Japanese Patent Application No. 2009-052261. The disclosure thereof is incorporated herein by reference.

TECHNICAL FIELD

The present invention relates to a circuit design supporting apparatus, and a circuit design support method, that are used for a logic circuit design, and more particularly, to a circuit design supporting apparatus, and a circuit design support method that are used for a failure analysis.

BACKGROUND ART

In a typical manufacturing process of a semiconductor integrated circuit, defective products are included in produced products in a constant rate, so that the defective products are removed through a test process, and only good products are delivered rate of the good products at this time is referred to as a "yield". If the yield is low, a manufacturing cost increases to put pressure on profits. For this reason, it is necessary to clarify a cause of a failure by failure analysis to improve the manufacturing process, and thereby improve the yield (for example, Japanese Patent Publication (JP 2006-133122A; patent literature 1).

The patent literature 1 discloses a technique that can deal with reduction of an amplitude voltage and an element size, and facilitate measurement of a voltage waveform by a laser voltage probe. In the technique of the patent literature 1, an observation target region for the voltage waveform and an LVP measuring element are connected to each other to perform LVP measurement with the LVP measuring element as a laser irradiation position, and thereby the voltage waveform is measured. At this time, a drain diffusion region and a source diffusion region of the LVP measuring element having a MOS capacitance structure are applied with the voltage waveform of the observation region by metal interconnections. Also, a gate is applied with a voltage waveform of reverse logic to that of the observation region. Thus, a bandgap of a channel surface of the LVP measuring element can vary along with a logic transition of the observation region, and thereby a situation in which the Franz-Keldysh effect appears to change an optical absorbance is observed by the LVP measurement.

However, as an integration degree of a circuit is increased, failure analysis of the circuit becomes difficult. For example, voltage waveform measurement by an electron beam system (EB measurement) is difficult because, in a current situation in which the number of interconnection layers increases to around eight, the interconnection layer to be measured is not often exposed. Also, a laser voltage probe measurement method (hereinafter, to be referred to as an LVP (Laser Voltage Probe)) is a method that measures a voltage waveform by laser irradiation from a back surface of a chip, and usable even in the case of a large number of interconnection layers. However, due to a lack of resolution, it is impossible to measure all transistors in the 90 nm generation or the subsequent.

Also, as a method of measuring a voltage waveform inside an integrated circuit, the following method is considered. That is, an interconnection exposure process is performed by an FIB (Focused Ion Beam) apparatus, and then the EB measurement is performed. However, this method requires quite a lot of work time. For this reason, first, it is necessary to roughly estimate a failure position with failure diagnostic software, and then to specify the failure position through measurement on the basis of a result of the estimation. It should be noted that the failure diagnostic software is software that "estimates" the failure position on the basis of a circuit diagram of the integrated circuit and a test result. Also, the failure position extracted from the estimation is referred to as a "failure candidate".

It should be noted that the number of "failure candidates" estimated by the above failure diagnostic software may be very large depending on a structure of a desired circuit. A measurement is required to check which of the failure candidates is a true failure, and in the measurement, the interconnection exposure process by the FIB system is performed as described above. For this reason, as the number of failure candidates increases, a measurement time becomes longer, and therefore a work time required for failure analysis is increased.

Non-patent literature 1 describes an observation point selecting method intended to improve easiness of failure analysis in a few observation points. According to the method, by referring to gate level circuit connection data (netlist), observation points are first inserted into all nodes inside a circuit. Then, the number of failures (equivalent failures) Np that cannot be specified by external observation is calculated. At this time, all the nodes in the circuit can be observed, and therefore Np is 0. Subsequently, observation points are removed from nodes such that Np is not increased and removal of the observation points causes only a small increase in Np, even if observation points are removed. That is, the observation points are removed with the increase in Np being suppressed minimally. Thus, it is expected that the easiness of failure analysis is improved with a small number of observation points.

According to Non-patent literature 1, when the insertion positions of the observation points are determined, only the circuit netlist is used, but a failure generation probability at each of the nodes is not taken into account. For this reason, the observation points may be uselessly inserted into nodes at which the failure generation probability is low. There is known a technique on a circuit design system that can efficiently facilitate failure analysis with fewer observation points (for example, patent literature 2).

The patent literature 2 discloses a circuit design system provided with a storage section 103, a failure candidate extracting section 109, a determining section 111, and an observation point insertion section 113. FIG. 1 is a block diagram illustrating the configuration of the circuit design system disclosed in the patent literature 2.

Referring to FIG. 1, the storage section 103 stores a netlist NET. The failure candidate extracting section 109 extracts equivalent failure groups $G_1$ to $G_I$ (I is an integer not less than 1) from the netlist NET, and generates failure candidate data CAN showing the equivalent failure group $G_i$ (i is an integer not less than 1 and not more than I).

The equivalent failure group $G_i$ includes a plurality of nodes $N_{i1}$ to $N_{iJi}$ (Ji means the number of nodes included in the equivalent failure group $G_i$). The determining section 111 determines a target node into which an observation point used for failure analysis is inserted, from the plurality of nodes $N_{i1}$ to $N_{iJi}$. In this process, the determining section 111 determines the target node based on the number of nodes Ji. The observation point insertion section 113 inserts one or more observation points into the target node to update the netlist NET.

In the conventional circuit design system, the determining section determines the target node into which the at least one observation point used for failure analysis is inserted, from the plurality of nodes $N_{i1}$ to $N_{iJi}$. The observation point insertion section inserts the at least one observation point into the target node to thereby update the netlist. FIG. 2 is a layout diagram illustrating a layout of a circuit designed by the circuit design system described in the patent literature 2. As illustrated in FIG. 2, in the circuit, elements (hereinafter may be described as LVP_PADs) that are analyzable by the laser voltage probe measurement method are newly additionally inserted. However, if an observation point is inserted into a critical path (maximum delay path), an operation speed of the entire circuit may be reduced because of an increase in delay. If this causes a problem, the LVP_PAD is selectively inserted into a position not corresponding to the critical path (maximum delay path) in the conventional technique.

CITATION LIST

Patent Literature

Patent literature 1: JP 2006-133122A
Patent literature 2: JP 2007-122422A

Non Patent Literature

Non-patent literature 1: "Z-DFD: Design-for-Diagnosability based on the concept of z-ditection" (International Test Conference, 2004, Proceedings, November 2004) by Irith Pomeranz, Srikanth Venkataraman, and Sudhakar M. Reddy

SUMMARY OF THE INVENTION

In an aspect of the present invention, a circuit design supporting apparatus includes: an observation portion specifying section configured to specify a first portion with a high improvement effect of analysis easiness in failure analysis of an integrated circuit as an observation portion; and an element substitution performing section configured to substitute an element arranged in the observation portion by an analysis target element to which a failure analysis apparatus can appropriately conduct the failure analysis based on a data of the observation portion.

In another aspect of the present invention, circuit design supporting method is achieved by specifying, by an observation portion specifying section, a first portion with a high improvement effect of analysis easiness in failure analysis of an integrated circuit as an observation portion; and by substituting, by an element substitution performing section, an element arranged in the observation portion by an analysis target element to which a failure analysis apparatus can appropriately conduct the failure analysis based on a data of the observation portion. The substituting an element arranged in the observation portion is achieved by performing timing analysis of the integrated circuit shown by a netlist; by calculating a delay in the integrated circuit based on a result of the timing analysis and the netlist; by specifying a fine element, which is arranged in the observation portion, of elements of the integrated circuit as a substitution candidate element; and by updating the netlist to form a new netlist. The calculating a delay is achieved by calculating a delay change when substituting the element arranged in the observation portion by the analysis target element. The specifying a fine element is achieved by generating an instruction to the element substituting section to substitute the substitution candidate element by the analysis target element, if the delay change when the substitution candidate element is substituted by the analysis target element is within a preset timing margin. The updating is achieved by forming the new netlist by substituting the substitution candidate element by the analysis target element in response to the instruction from the substitution element determining section.

In still another aspect of the present invention, a computer-readable recording medium in which a computer-executable program code is stored to realize a circuit design supporting method which is achieved by specifying, by an observation portion specifying section, a first portion with a high improvement effect of analysis easiness in failure analysis of an integrated circuit as an observation portion; and by substituting, by an element substitution performing section, an element arranged in the observation portion by an analysis target element to which a failure analysis apparatus can appropriately conduct the failure analysis based on a data of the observation portion. The substituting an element arranged in the observation portion is achieved by performing timing analysis of the integrated circuit shown by a netlist; by calculating a delay in the integrated circuit based on a result of the timing analysis and the netlist; by specifying a fine element, which is arranged in the observation portion, of elements of the integrated circuit as a substitution candidate element; and by updating the netlist to form a new netlist. The calculating a delay is achieved by calculating a delay change when substituting the element arranged in the observation portion by the analysis target element. The specifying a fine element is achieved by generating an instruction to the element substituting section to substitute the substitution candidate element by the analysis target element, if the delay change when the substitution candidate element is substituted by the analysis target element is within a preset timing margin. The updating is achieved by forming the new netlist by substituting the substitution candidate element by the analysis target element in response to the instruction from the substitution element determining section.

According to the present invention, an observation portion can be arranged in a critical path (a circuit region in which a setup delay margin is small).

BRIEF DESCRIPTION OF THE DRAWINGS

The above and other objects, advantages and features of the present invention will be more apparent from the following description of certain embodiments taken in conjunction with the accompanying drawings, in which:

FIG. 4 is a block diagram showing a connection relation in the circuit design supporting apparatus of the first embodiment;

FIG. 7 is a block diagram showing a configuration of the circuit design supporting apparatus according to a second embodiment of the present, invention;

DESCRIPTION OF EMBODIMENTS

Figure 1:
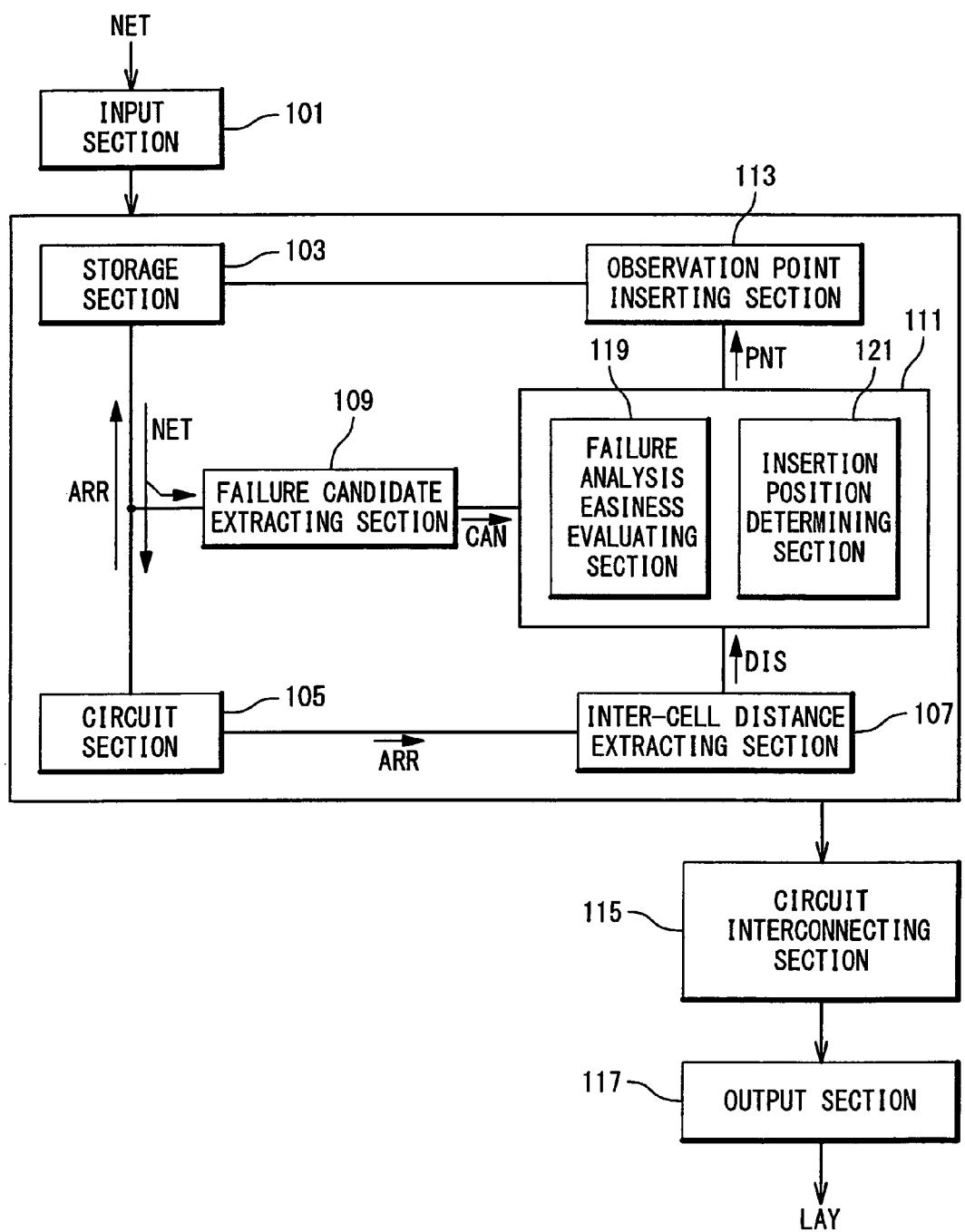
FIG. 1 is a block diagram illustrating a configuration of a conventional circuit design system.
Figure 2:
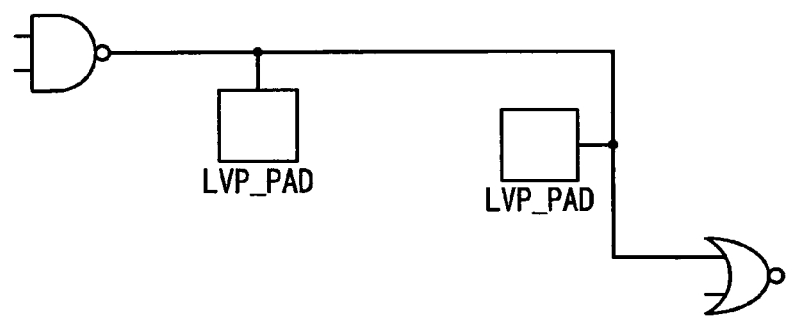
FIG. 2 is a layout diagram illustrating a layout of a circuit designed by the conventional circuit design system.

Hereinafter, a circuit design supporting apparatus of the present invention will be described in detail with reference to the attached drawings. It should be noted that the same components are denoted by the same reference numerals in principle, and redundant description of them is omitted.

First Embodiment

Figure 3:
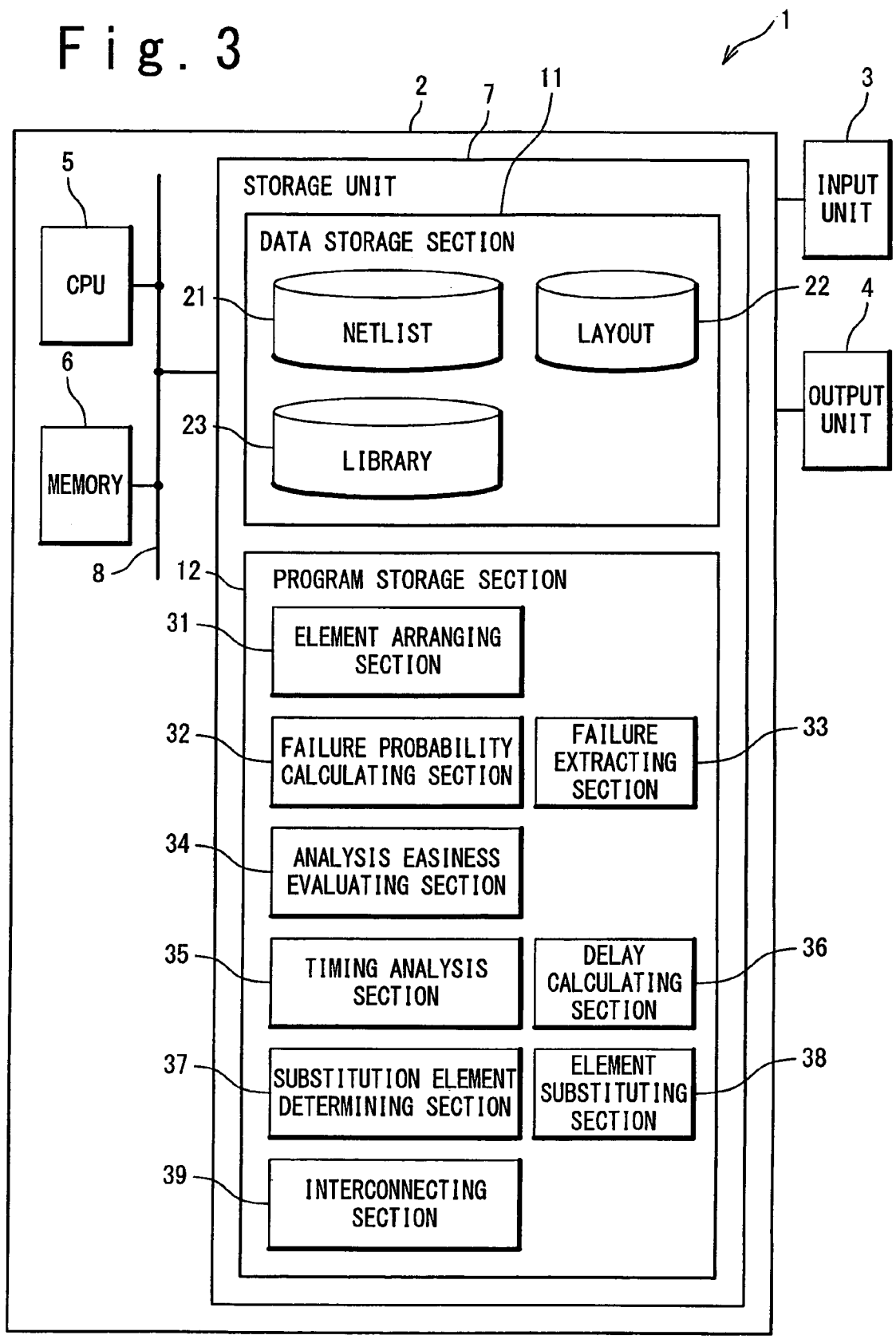
FIG. 3 is a block diagram showing a configuration of a circuit design supporting apparatus according to a first embodiment of the present invention.

FIG. 3 is a block diagram showing a configuration of a circuit design supporting apparatus 1 according to a first embodiment of the present invention. The circuit design supporting apparatus 1 includes an information processing unit 2, an input unit 3, and an output unit 4. The information processing unit 2 is connected to the input unit 3 and the output unit 4. The information processing unit 2 is an apparatus that operates according to a procedure indicated by a computer program which is loaded from a program recording medium and which performs information processing at high speed. The information processing unit 2 is provided with five basic functions, i.e., input, storage, calculation, control, and output. The input unit 3 is a man-machine interface that inputs data to the information processing unit 2. The output unit 4 is a man-machine interface that outputs a result of the processing by the information processing unit 2 to the outside.

The information processing unit 2 is provided with a CPU (Central Processing Unit) 5, a memory 6, and a storage unit (HDD) 7, which are connected to each other through a bus 8. The CPU 5 performs control of various devices provided in the information processing unit 2, and data processing. The CPU 5 interprets data received from the input unit 3 to perform a calculation, and outputs a result of the calculation to the output unit 4. The memory 6 is a storage device that is represented by a RAM or the like and stores data. The memory 6 is used when the CPU 5 performs calculations. The storage unit 7 is a storage device represented by an HDD (Hard Disk Drive), and stores data related to the present embodiment.

The storage unit 7 is provided with a data storage section 11 and a program storage section 12. The data storage section 11 is configured to store a netlist 21, an element layout data 22, and a library 23. The program storage section 12 is configured to store an element arranging section 31, a failure probability calculating section 32, a failure extracting section 33, an analysis easiness evaluating section 34, a timing analyzing section 35, a delay calculating section 36, a substitution element determining section 37, an element substituting section 38, and a interconnecting section 39.

Referring to the drawings, a connection relation in respective functional blocks in the present embodiment will be described. FIG. 4 is a block diagram showing the connection relation in the circuit design supporting apparatus 1 of the present embodiment. The circuit design supporting apparatus 1 includes a circuit design support functional block 24; an input section 27 that is provided at a stage prior to the circuit design support functional block 24; and an output section 28 that is provided at a stage subsequent to the circuit design support functional block 24. Also, in the circuit design supporting apparatus 1 of the present embodiment, the interconnecting section 39 is provided between the output section 28 and the circuit design support functional block 24.

Also, the circuit design support functional block 24 includes an observation portion specifying section 25 and an element substitution performing section 26. The observation portion specifying section 25 selects a circuit element with a high improvement effect of analysis easiness through observation portion insertion on the basis of the netlist 21 and the element layout data 22. The observation portion specifying section 25 includes the failure probability calculating section 32, the failure extracting section 33, and the analysis easiness evaluating section 34.

The element substitution performing section 26 substitutes a circuit element that is difficult to analyze by an analyzer by an analyzable circuit element on the basis of the netlist 21 and the element layout data 22. The element substitution performing section 26 includes the timing analyzing section 35, the delay calculating section 36, the substitution element determining section 37, and the element substituting section 38.

Referring to FIG. 4, the element arranging section 31 of the circuit design support functional block 24 is configured to read the netlist 21. The element arranging section 31 performs element arrangement on the basis of the read netlist 21 to generate the element layout data 22. The element arranging section 31 refers to the netlist stored in the data storage section 11 to arrange a cell group of a design target circuit. Then, the element arranging section 31 generates the element layout data 22 representing the arrangement of the cell group. The element layout data 22 is stored in the data storage section 11, and also outputted to an inter-cell distance extracting section (not illustrated). The inter-cell distance extracting section calculates and extracts an inter-cell distance data on the basis of the arrangement of the cell group represented by the received element layout data 22. The inter-cell distance data is outputted to the observation portion specifying section 25.

The failure probability calculating section 32 is connected to the analysis easiness evaluating section 34. Also, the failure probability calculating section 32 is configured to read the element layout data 22. The failure probability calculating section 32 supplies a calculated failure probability to the analysis easiness evaluating section 34.

The failure extracting section 33 is connected to the analysis easiness evaluating section 34. Also, the failure extracting section 33 is configured to read the netlist 21. The failure extracting section 33 supplies an equivalent failure to the analysis easiness evaluating section 34. The failure extracting section 33 refers to the netlist to extract a "failure candidate group" from a desired circuit, and generates a failure candidate data representing the failure candidate group. It should be noted that a failure candidate means a failure, a position of which cannot be specified through measurement at an external point, and even by use of failure diagnostic software, the failure position cannot be specified. The failure candidate group as a group of failures, positions of which cannot be specified may be referred to as an "equivalent failure group, or equivalent fault class". It can be said that the failure extracting section 33 extracts the equivalent failure group from the netlist, and generates the failure candidate data representing the equivalent failure group. The failure candidate data is outputted to the analysis easiness evaluating section 34.

Each of the failure candidates of the group includes a plurality of nodes. An observation portion used for failure analysis is inserted into at least one node of the plurality of nodes (hereinafter to be referred tows a "target node"). The observation portion specifying section 25 determines the target node. The observation portion specifying section 25 receives the failure candidate data and an inter-cell distance data. Then, the observation portion specifying section 25 determines the node to which at least one observation portion should be inserted, from among the plurality of nodes included in the equivalent failure group represented by the failure candidate data. It should be noted that according to the present embodiment, the observation portion specifying section 25 selects and determines at least one target node while referring to the inter-cell distance data generated by the inter-cell distance extracting section (not illustrated).

More specifically, the observation portion specifying section 25 includes the analysis easiness evaluating section 34. The analysis easiness evaluating section 34 is connected to the substitution element determining section 37 of the element substitution performing section 26. The analysis easiness evaluating section 34 evaluates analysis easiness on the basis of data supplied from the failure probability calculating section 32 and the failure extracting section 33, and selects a circuit element with a high improvement effect of analysis easiness through observation portion insertion. Also, the analysis easiness evaluating section 34 refers to the inter-cell distance represented by the inter-cell distance data to thereby calculate and evaluate "easiness of failure analysis" of each of the plurality of nodes included in the equivalent failure group.

The observation portion specifying section 25 determines at least one target node in this manner, and generates an observation portion inserting position data representing the determined target node. The observation portion inserting position data is outputted to the element substitution performing section 26. The substitution element determining section 37 of the element substitution performing section 26 selects and determines the target node from among the plurality of nodes on the basis of the obtained easiness of failure analysis. The element substitution performing section 26 refers to the netlist 21 stored in the data storage section 11 to substitute an observation portion for at least one of the target nodes included in the circuit. Thus, the element substitution performing section 26 updates the netlist stored in the data storage section 11.

The timing analyzing section 35 is configured to read the netlist 21 and the element layout data 22. The timing analyzing section 35 performs timing analysis on the basis of the read netlist 21 and element layout data 22. Also, the timing analyzing section 35 is connected to the delay calculating section 36 and the substitution element determining section 37. The timing analyzing section 35 supplies a result of the timing analysis to the delay calculating section 36 or the substitution element determining section 37.

The delay calculating section 36 is connected to the substitution element determining section 37. The delay calculating section 36 is configured to read the netlist 21. The delay calculating section 36 calculates a delay variation on the basis of the read netlist 21 and data on a parasitic capacitor and waveform roundness.

The substitution element determining section 37 is connected to the element substituting section 38. The substitution element determining section 37 receives a data on the delay variation supplied from the delay calculating section 36, a data on a critical path, a timing margin, a timing violation path, and the like supplied from the timing analyzing section 35, and a data on the circuit element with a high improvement effect of analysis easiness supplied from the analysis easiness evaluating section 34.

The substitution element determining section 37 refers to the data received from the delay calculating section 36 to extract a delay variation when the circuit element with the high improvement effect of analysis easiness (substitution candidate element) is substituted by a circuit element having an analyzable size (analysis target element). If the delay variation after the element substitution processing has been performed falls within the timing margin, the substitution element determining section 37 supplies an element substitution instruction data to the element substituting section 38.

The element substituting section 38 actually executes, the substituting process on the netlist 21 on the basis of the element substitution instruction data received from the substitution element determining section 37. The element arranging section 31 executes an element arranging process on the new netlist 21 obtained after the substituting process, and newly generates the element layout data 22.

The circuit design support functional block 24 supplies the new netlist 21 and the element layout data 22 to the interconnecting section 39. The interconnecting section 39 performs an interconnection process on the new netlist 21 and the element layout data 22 to configure an interconnection layout.

As necessary, the above-described processing flow is repeated. After the substituting process of the necessary observation portion has been completed, the interconnecting section 39 reads the netlist 21 and the element layout data 22 from the data storage section 11. Then, the interconnecting section 39 determines circuit interconnections, i.e., interconnections between cells on the basis of the netlist 21 and the element layout data 22. Thus, an interconnection layout data representing a circuit layout is generated. The generated interconnection layout data is outputted from the output section 28.

Figure 5A:
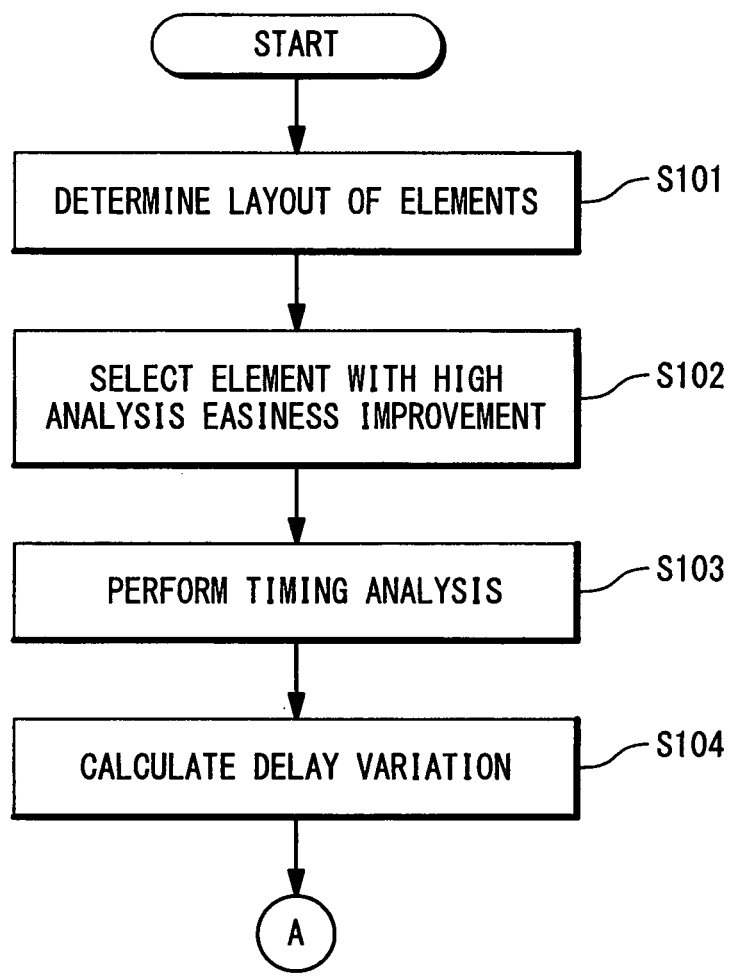
FIGS. 5A and 5B show a flowchart of an operation of a circuit design supporting functional block in the circuit design supporting apparatus of the first embodiment.
Figure 5B:
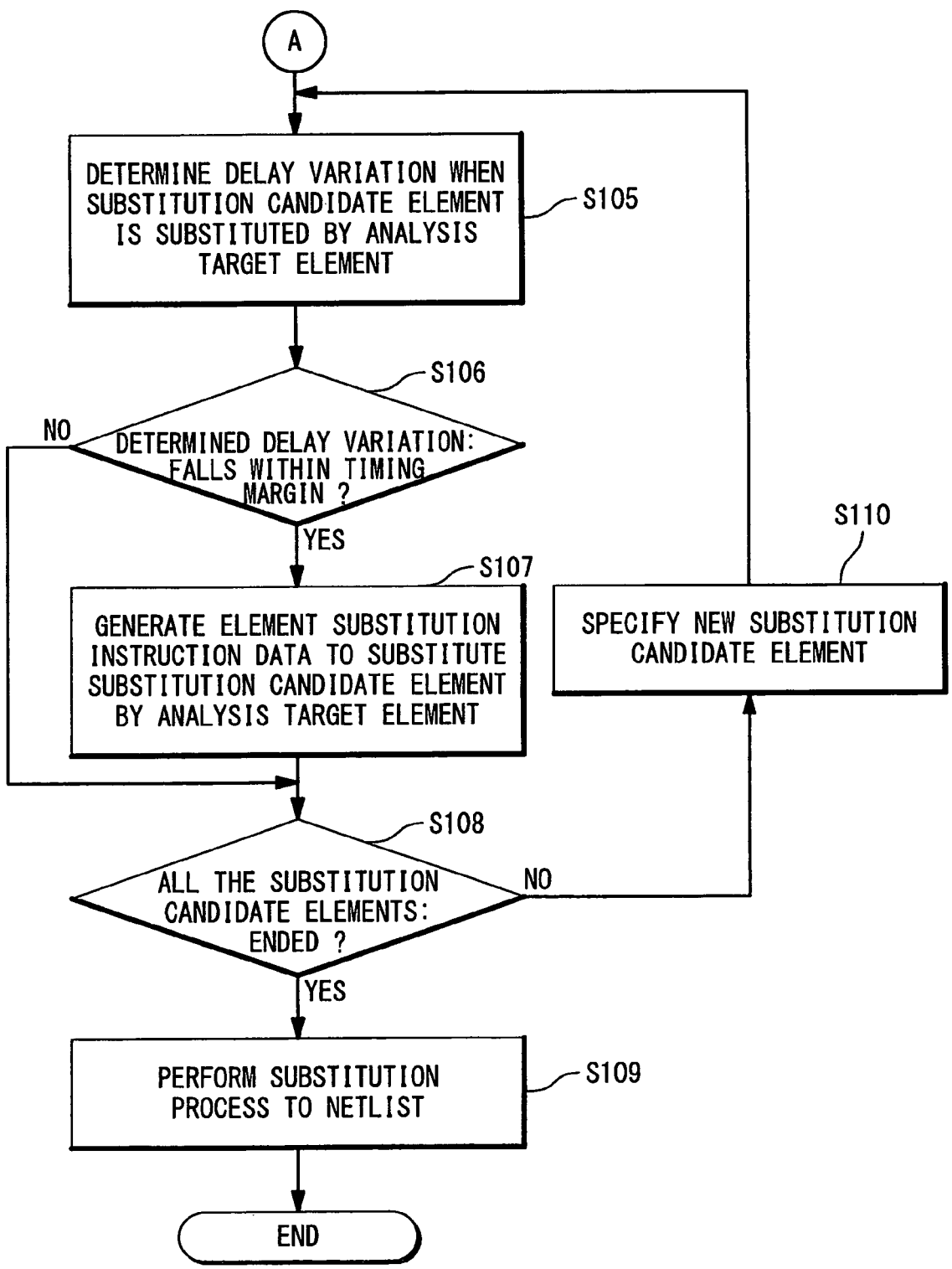

The operation of the circuit design supporting functional block 24 of the present embodiment will be described. FIGS. 5A and 5B show a flowchart of a specific operation of the circuit design supporting functional block 24 in the first embodiment. In a step S101, the element arranging section 31 of the circuit design supporting functional block 24 reads the netlist 21 from the data storage section 11 to execute the element arranging process. The element arranging section 31 generates the element layout data 22 as a result of the element arranging process, and stores it in the data storage section 11.

In a step S102, the failure probability calculating section 32 of the observation portion specifying section 25 calculates a failure probability of a circuit for each net on the basis of the read element layout data 22. Also, the failure extracting section 33 extracts an equivalent failure on the basis of the read netlist 21. Then, the analysis easiness evaluating section 34 determines a net of which the number of equivalent failures is large and a failure probability is high as a difficult-to-analyze net, and evaluates analysis easiness. The analysis easiness evaluating section 34 selects a circuit element with a high improvement effect of analysis easiness through observation insertion on the basis of the evaluated analysis easiness (hereinafter may be described as a substitution candidate element).

In a step S103, the timing analyzing section 35 performs the timing analysis. The timing analyzing section 35 obtains data on a parasitic capacitor, waveform roundness, a critical path, a timing margin, a timing violation path, and the like through the timing analysis. The timing analyzing section 35 supplies the data on the parasitic capacitor and waveform roundness to the delay calculating section 36. Also, the timing analyzing section 35 supplies the data on the critical path, the timing margin, the timing violation path, and the like to the substitution element determining section 37.

In a step S104, the delay calculating section 36 calculates a delay variation when a fine circuit element that is listed in the netlist 21 and difficult to analyze by an analyzer is substituted by an analyzable circuit element of a large area. At this time, the delay calculating section 36 calculates each of delay variations when all the fine circuit elements included in the netlist 21 are substituted by the large area circuit elements (hereinafter to be sometimes referred to as analysis target elements). The delay calculating section 36 supplies data on the delay variations obtained through the calculation to the substitution element determining section 37.

In a step S105, the substitution element determining section 37 specifies a substitution candidate element on the basis of the data supplied from the analysis easiness evaluating section 34 of the observation portion specifying section 25. The substitution element determining section 37 determines the delay variation when the substitution candidate element is substituted by the analysis target element, on the basis of the data from the delay calculating section 36.

In a step S106, the substitution element determining section 37 makes a determination of whether or not the delay variation when a specified substitution candidate element is substituted by the analysis target element falls within the timing margin supplied from the timing analyzing section 35. If the delay variation falls within the timing margin as a result of the determination, the processing flow proceeds to a step S107, where an instruction data for substituting the specified substitution candidate element by the analysis target element (a substitution instruction data) is generated. On the other hand, if the delay variation does not fall within the timing margin, the processing flow proceeds to a step S108. At this time, the element with the delay variation not falling within the timing margin may be recorded, and the substituting process of the element may be dynamically forbidden.

In the step S108, the substitution element determining section 37 makes a determination of whether or not all the substitution candidate elements have been checked, on the basis of the data received from the analysis easiness evaluating section 34. If there is any element not having been subjected to the check as a result of the determination, the processing flow proceeds to a step S110, where a new substitution candidate element is specified, and then returns to the step S105. On the other hand, if all the substitution candidate elements have been subjected to the check, the processing flow proceeds to a step S109.

In the step S109, the element substituting section 38 receives the substitution instruction data generated by the substitution element determining section 37. The element substituting section 38 generates a new netlist 21 from the netlist 21 having been stored in the data storage section 11 by substituting the substitution candidate element to which the substituting process can be applied, by the analysis target element on the basis of the substitution instruction data.

Figure 6A:
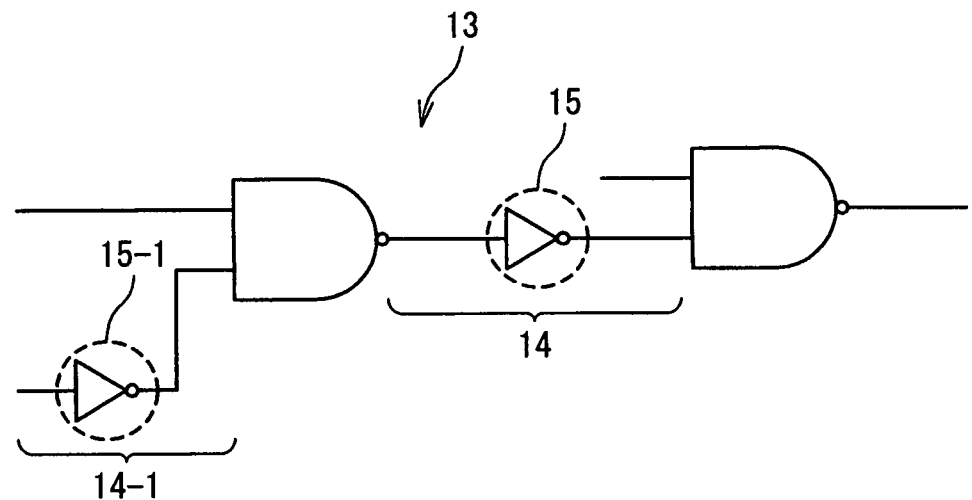
FIGS. 6A and 6B are circuit diagrams showing a configuration of an integrated circuit designed by the circuit design supporting apparatus of the first embodiment.
Figure 6B:
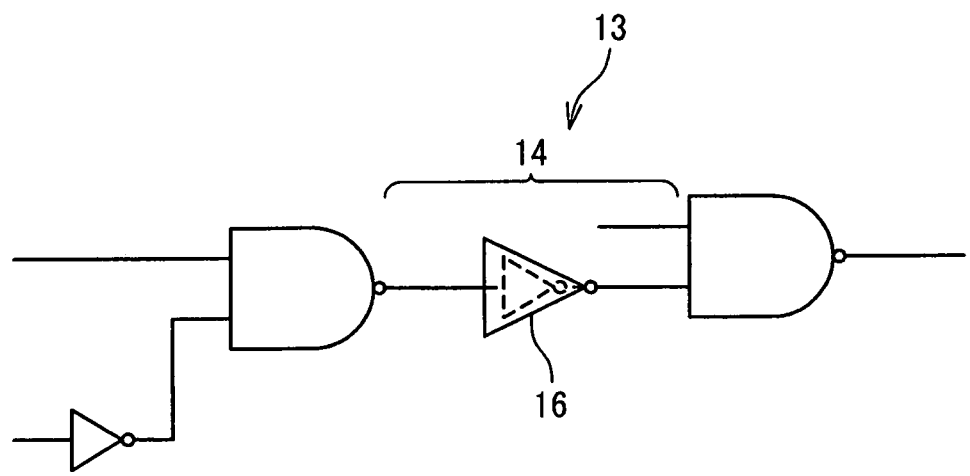

FIGS. 6A and 6B are circuit diagrams conceptually showing an effect of the circuit design supporting apparatus 1 of the present embodiment. FIGS. 6A and 6B show a part of an integrated circuit 13 designed by the circuit design supporting apparatus 1 of the present embodiment. FIG. 6A shows a state when a circuit element with a high improvement effect of analysis easiness (substitution target element 15) which is included in an observation portion 14 is specified on the basis of analysis easiness. FIG. 6B shows the integrated circuit 13 when the substitution target element 15 has been substituted by a large area circuit element (analysis target element 16) that is analyzable by an analyzer.

As in the conventional technique, when a new element for analysis (LVP_PAD) is inserted, the operation speed of a circuit is reduced. For this reason, it is difficult to insert the element for analysis (LVP_PAD) into a critical path having a small setup timing margin. As illustrated in FIGS. 6A and 6B, in the circuit design Supporting apparatus 1 of the present embodiment, the new element for analysis (LVP_PAD) is not inserted into the integrated circuit 13 but substitutes a substitution target element 15 by an analysis target element 16, If the substitution by an element with a large transistor size is made, a circuit operation speed is often increased. Thus, the analysis target element 16 can be provided with a critical path of the integrated circuit 13.

Also, in the circuit design supporting apparatus 1 of the present embodiment, the new element (LVP_PAD) is not added but the substitution by the element with a large transistor size is performed, to thereby achieve analysis easiness. The transistor size of the element is increased, so that a new timing violation due to addition of the new element (LVP_PAD) can be suppressed.

It should be noted that to facilitate the understanding of the present invention, the above-described embodiment shows the case where the one substitution target element 15 is arranged in the observation portion 14. In the circuit design supporting apparatus 1 of the present embodiment, if a plurality of substitution target elements 15 are present in the observation portion 14, at least one of them is preferably substituted by the analysis target element 16. Also, when a timing violation occurs if one of the substitution target elements 15 is substituted by the analysis target element 16 under the condition that a plurality of substitution target elements 15 are arranged, the plurality of substitution target elements 15 are preferably substituted by the analysis target element 16 if the timing violation is resolved by substituting two or more of them.

Further, when a timing violation occurs, if the one substitution target element 15 present in the observation portion 14 is substituted by the analysis target element 16, under the condition that a substitution target element 15-1 is present in another observation portion 14-1, both of the substitution target elements 15 and 15-1 are preferably substituted if the timing violation is resolved by substituting the substitution target element 15-1 together with the substitution target element 15.

Second Embodiment

The circuit design supporting apparatus 1 according to a second embodiment of the present invention will be described below. FIG. 7 is a block diagram showing a configuration of the circuit design supporting apparatus 1 of the second embodiment. The circuit design supporting apparatus 1 of the second embodiment is provided with a specific substitution candidate element determining section 41. The specific substitution candidate element determining section 41 determines as a specific substitution candidate element, one circuit element, which is to be substituted by an analysis target element to thereby resolve or reduce the timing violation, of fine circuit elements present in a setup timing violation path.

Figure 8:
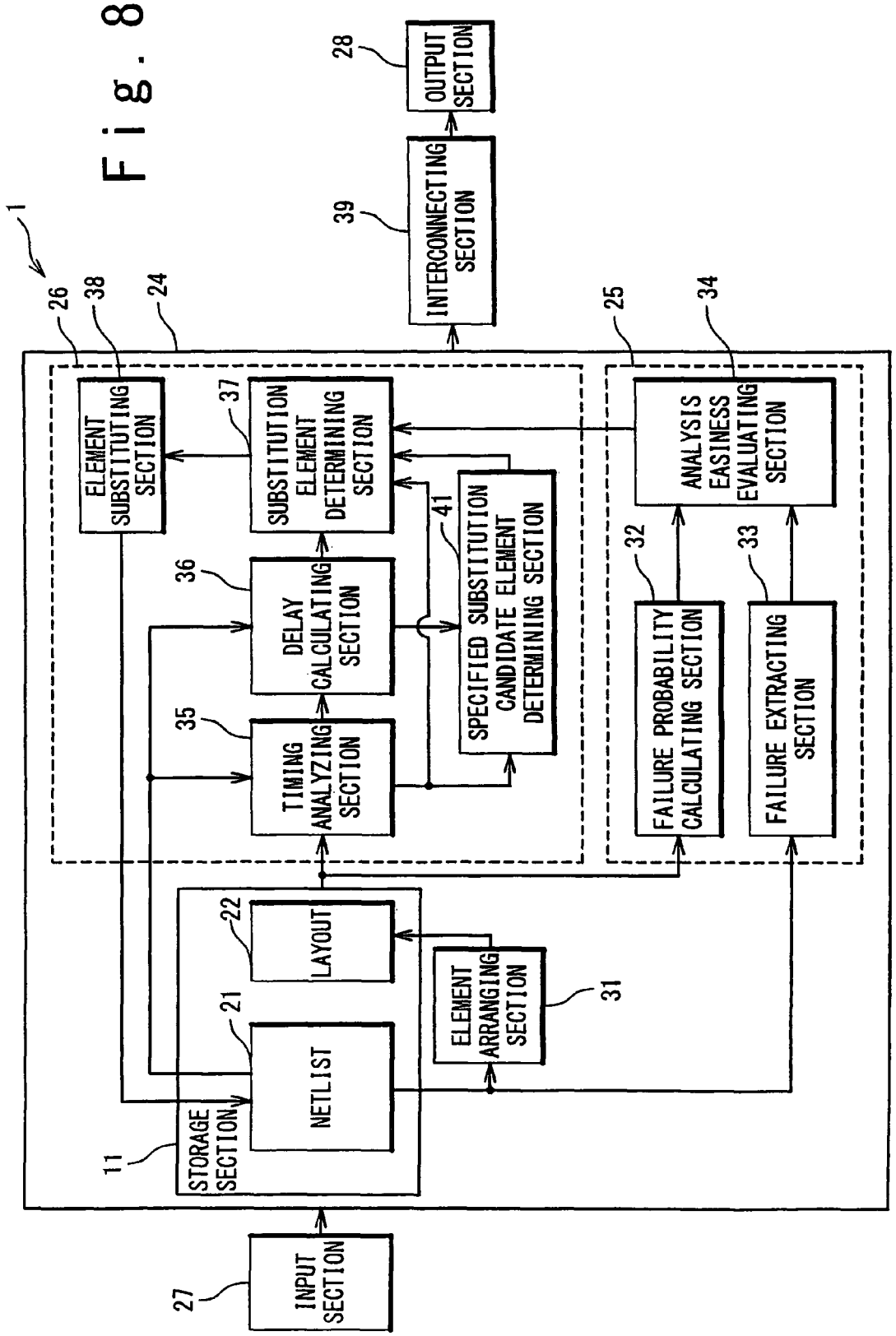
FIG. 8 is a block diagram showing a connection relation in the circuit design support element of the second embodiment.

FIG. 8 is a block diagram showing a connection relation in the circuit design supporting apparatus 1 of the second embodiment. As illustrated in FIG. 8, the specific substitution candidate element determining section 41 is arranged in an element substitution performing section 26. The specific substitution candidate element determining section 41 is connected to the timing analyzing section 35, the delay calculating section 36, and the substitution element determining section 37. The specific substitution candidate element determining section 41 receives a timing violation path data from the timing analyzing section 35. Also, the specific substitution candidate element determining section 41 receives a data on a delay variation from the delay calculating section 36. The specific substitution candidate element determining section 41 extracts the above-described specific substitution candidate element on the basis of the timing violation path data and the data on a delay variation.

The substitution element determining section 37 receives a data of the specific substitution candidate element (specific substitution candidate element data) to execute a substituting process on a setup timing violation path and a circuit element with a high improvement effect of analysis easiness.

Figure 9A:
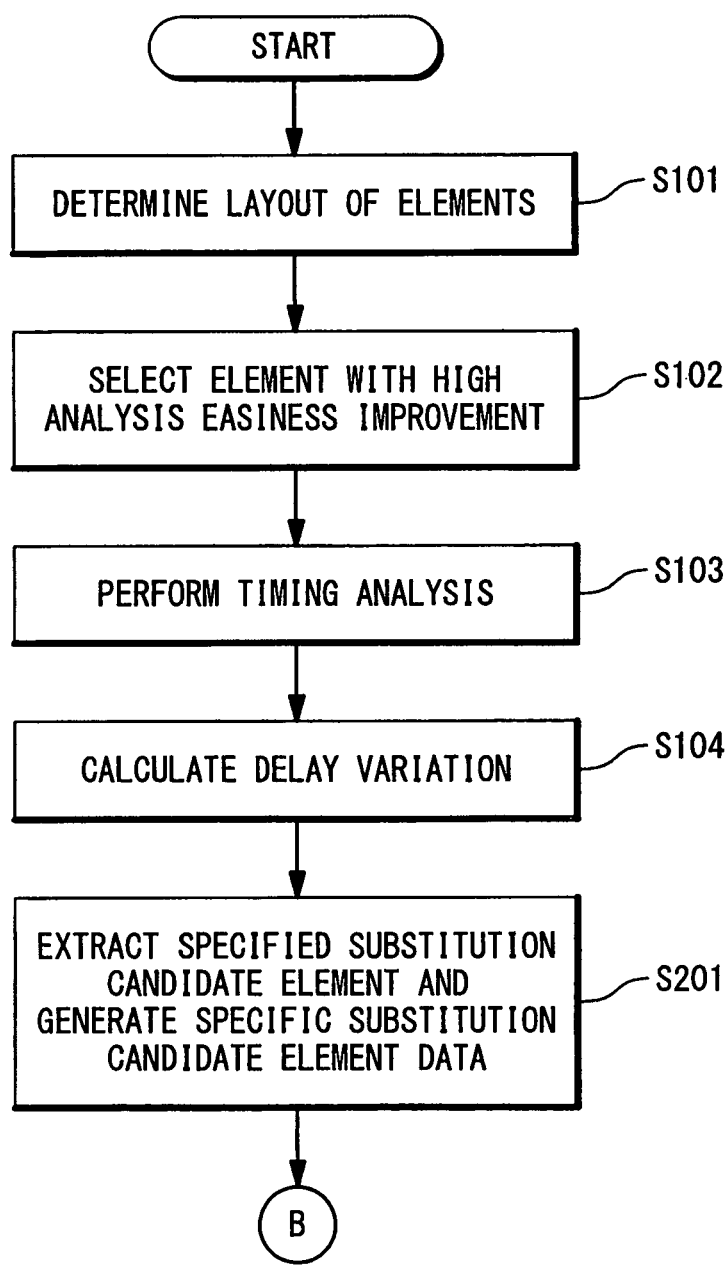
FIGS. 9A and 9B show a flowchart of an operation of a circuit design supporting functional block in the circuit design support element of the second embodiment.
Figure 9B:
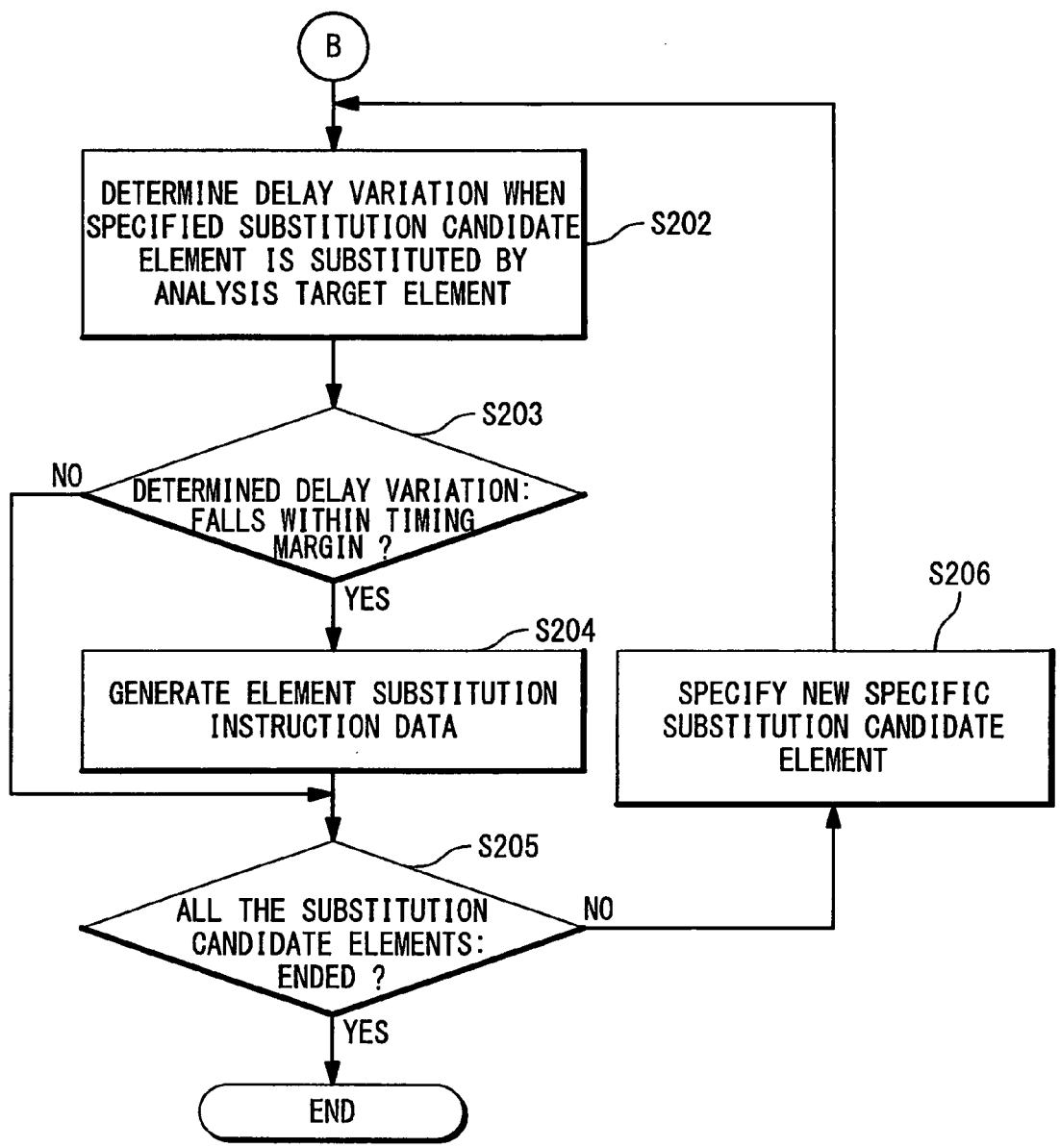

The operation of the circuit design supporting functional block 24 of the circuit design supporting apparatus 1 of the second embodiment will be described below. FIGS. 9A and 9B are a flowchart showing a specific operation of the circuit design supporting functional block 24 in the second embodiment.

The operations from step S101 to step S104 are the same as those in the first embodiment. In a step S201, the specific substitution candidate element determining section 41 receives the timing violation path data from the timing analyzing section 36, and also the data on the delay variation from the delay calculating section 36. The specific substitution candidate element determining section 41 extracts the fine circuit elements present in the setup timing violation path on the basis of the timing violation path data. The specific substitution candidate element determining section 41 specifies one circuit element, which is to be substituted by the analysis target element to thereby resolve or reduce the timing violation, of the extracted circuit elements. The specific substitution candidate element determining section 41 sets the specified circuit element as the specific substitution candidate element to generate data including a list of them (specific substitution candidate element data).

In step S202, the substitution element determining section 37 obtains the delay variation when the specific substitution candidate element is substituted by the analysis target element, on the basis of the specific substitution candidate element data received from the specific substitution candidate element determining section 41 and the data on the delay variation received from the delay calculating section 36.

In step S203, the substitution element determining section 37 makes a determination of whether or not the delay variation when the specific substitution candidate element is substituted by the analysis target element falls within a timing margin supplied from the timing analyzing section 35. If the delay variation falls within the timing margin as a result of the determination, the processing flow proceeds to step S204, where instruction data (substitution instruction data) for substituting the specific substitution candidate element by the analysis target element is generated. On the other hand, if the delay variation does not fall within the timing margin, the processing flow proceeds to step S205.

In the step S205, the substitution element determining section 37 makes a determination of whether or not all of the specific substitution candidate elements have been checked. If there are some elements not having been subjected to the check as a result of the determination, the processing flow proceeds to a step S206, where a new substitution candidate element is specified, and then returns to the step S202. On the other hand, if all of the specific substitution candidate elements have been subjected to the check, the processing flow of the specific substitution candidate elements is completed.

Subsequently, the circuit design supporting functional block 24 performs a process of substituting a circuit element (substitution candidate element), which is other than the specific substitution candidate elements and has a high improvement effect of analysis easiness, by a circuit element with an analyzable size (analysis target element).

If there is a path having a setup timing violation, the circuit design supporting apparatus 1 of the second embodiment can substitute a circuit element with an analysis easiness improvement effect (substitution candidate element) by a circuit element with an analyzable size (analysis target element) while resolving the timing violation. Also, in a typical design flow, when the timing violation is corrected, a layout engineer extracts an element on the violation path regardless of an analysis easiness improvement effect. For this reason, an element with a low analysis easiness improvement effect may be selected. The circuit design supporting apparatus 1 of the second embodiment can automatically check an element with a high improvement effect of analysis easiness and an element on the timing violation path. Thus, work efficiency can be improved, and time and cost associated with an integrated circuit design can be reduced.

Third Embodiment

Figure 10:
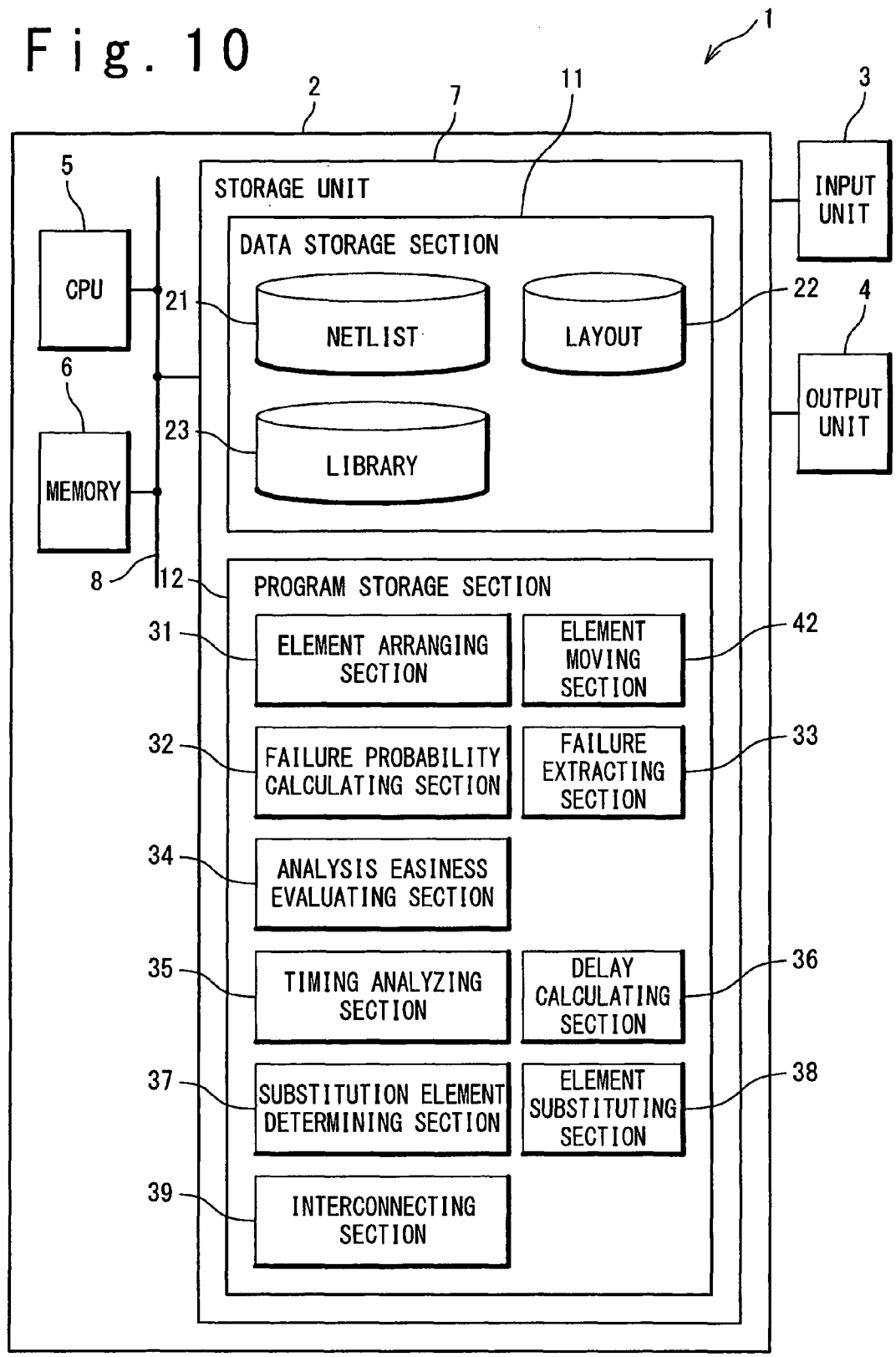
FIG. 10 is a block diagram showing a configuration of the circuit design supporting apparatus according to a third embodiment of the present invention.

The circuit design supporting apparatus 1 according to a third embodiment of the present invention will be described below. FIG. 10 is a block diagram showing a configuration of the circuit design supporting apparatus 1 of the third embodiment. The circuit design supporting apparatus 1 of the third embodiment is further provided with an element moving section 42 in addition to the circuit design supporting apparatus 1 of the first embodiment. The element moving section 42 checks an element layout after a substitution candidate element has been substituted by an analysis target element.

Figure 11:
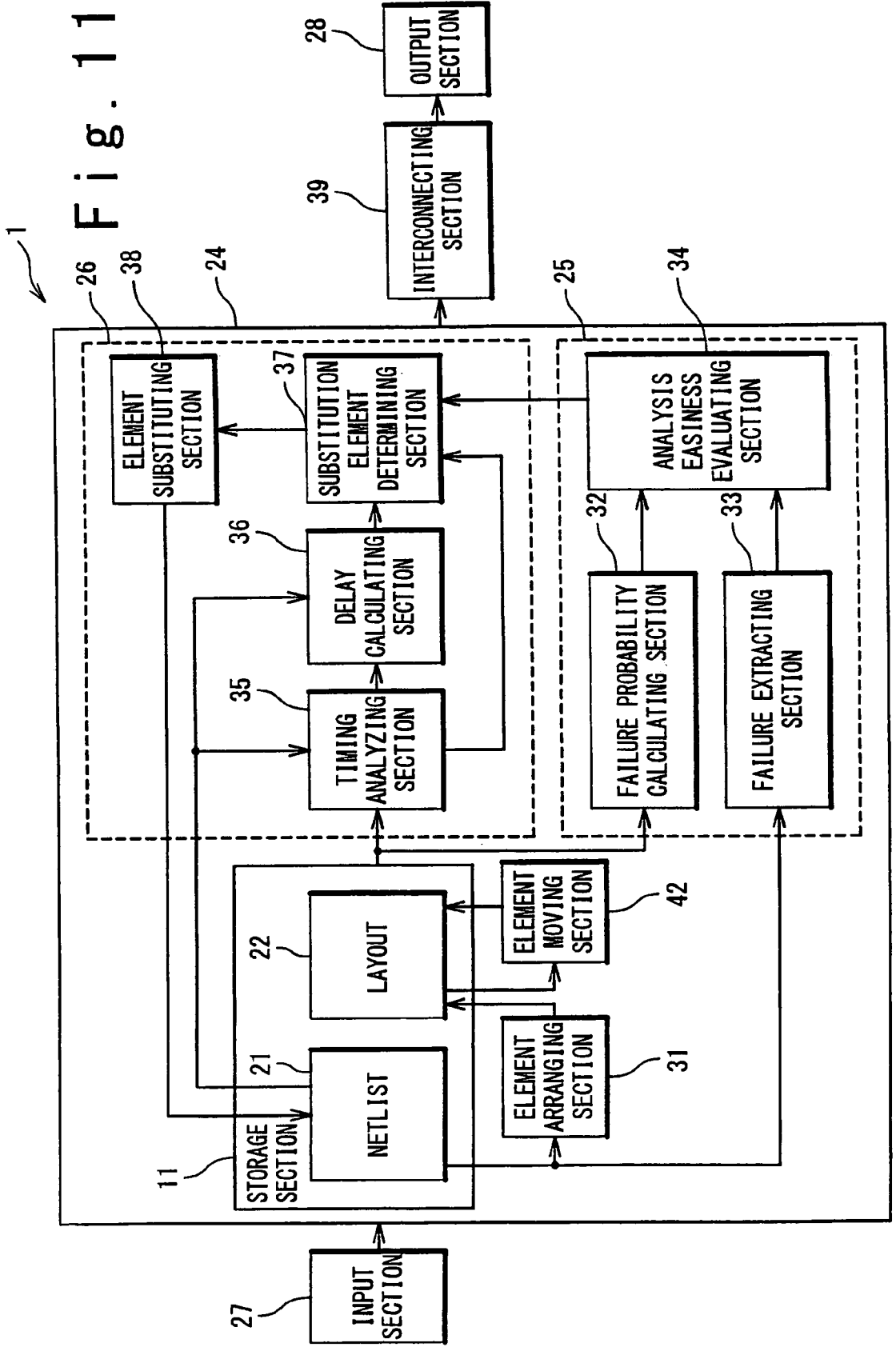
FIG. 11 is a block diagram showing a connection relation in the circuit design supporting apparatus of the third embodiment.

FIG. 11 is a block diagram showing a connection relation in the circuit design supporting apparatus 1 of the third embodiment. As illustrated in FIG. 11, the element moving section 42 is configured to read the element layout data 22. Specifically, the element moving section 42 of the third embodiment reads new element layout data 22 that is generated by performing the operation of the first embodiment. If overlap between elements is found in the new element layout data 22, the element moving section 42 moves the analysis target element to correct the element layout data 22.

Figure 12A:
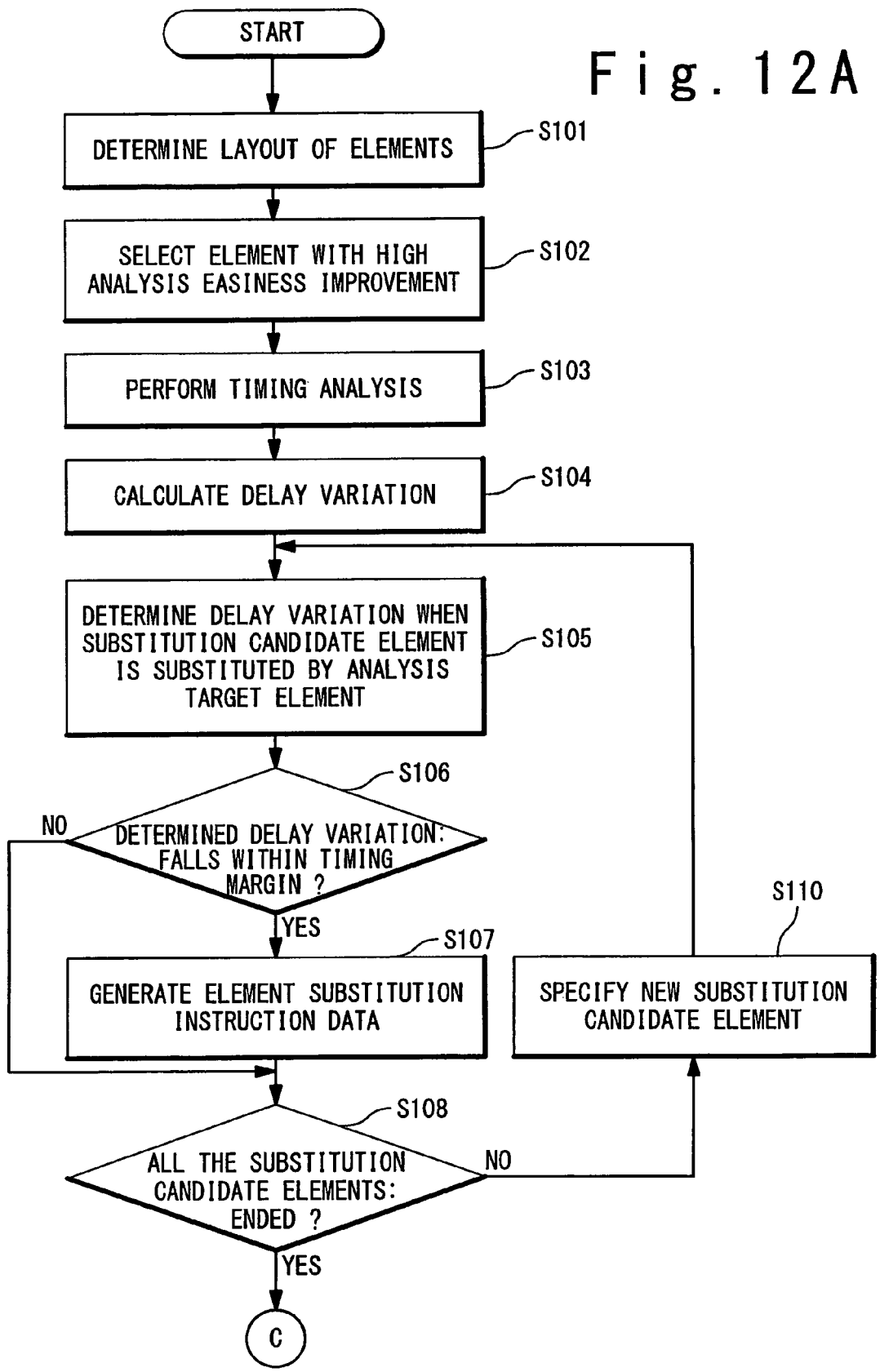
FIGS. 12A and 12B show a flowchart of an operation of the circuit design supporting functional block 24 in the circuit design supporting apparatus of the third embodiment.
Figure 12B:
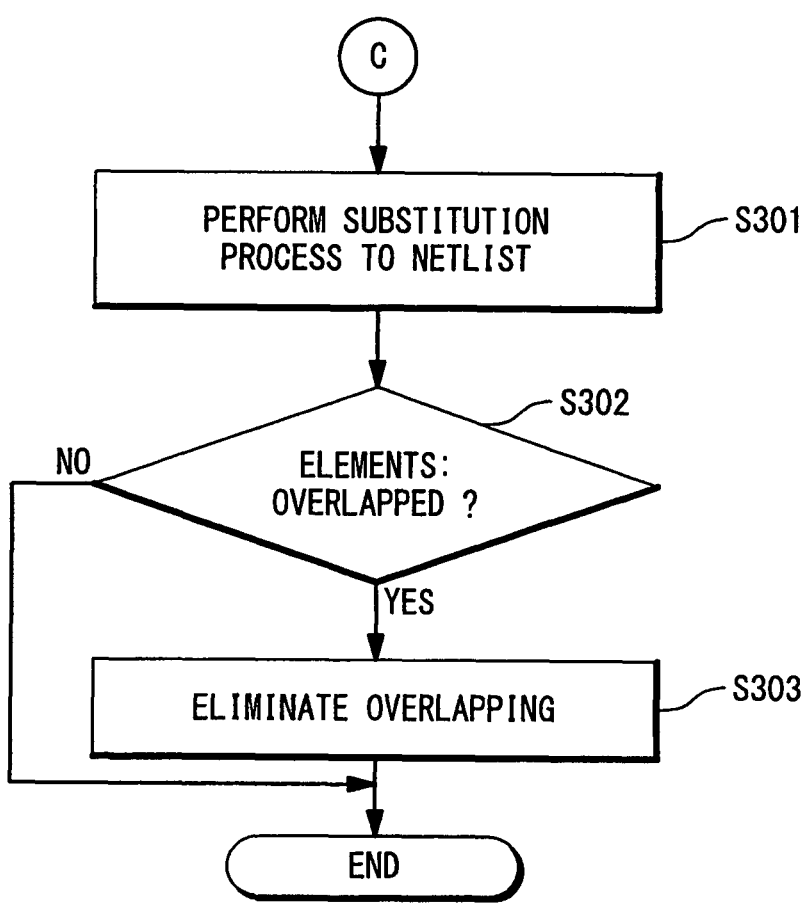

FIGS. 12A and 12B are a flowchart showing a specific operation of a circuit design supporting functional block 24 in the third embodiment. The circuit design supporting functional block 24 of the third embodiment operates in the same manner as the circuit design supporting functional block 24 of the firs embodiment from the step S101 to the step S108.

In a step S301, the element substituting section 38 receives the substitution instruction data generated by the substitution element determining section 37, and substitutes a substituting process performable substitution candidate element by the analysis target element on the netlist 21 stored in the data storage section 11 on the basis of the substitution instruction data, to form a new netlist 21. The element arranging section 31 executes the element arranging process on the new netlist 21. The element arranging section 31 generates new element layout data 22 as the execution result, and stores it in the data storage section 11.

In a step S302, the element moving section 42 reads the new element layout data 22 stored in the data storage section 11 to make a determination of whether or not there is overlap between elements. If the overlap is found as a result of the determination, a processing flow proceeds to a step S303, where the analysis target element is moved to eliminate the overlap. On the other hand, if there is no overlap as the result of the determination, the processing flow is completed.

Figure 13A:
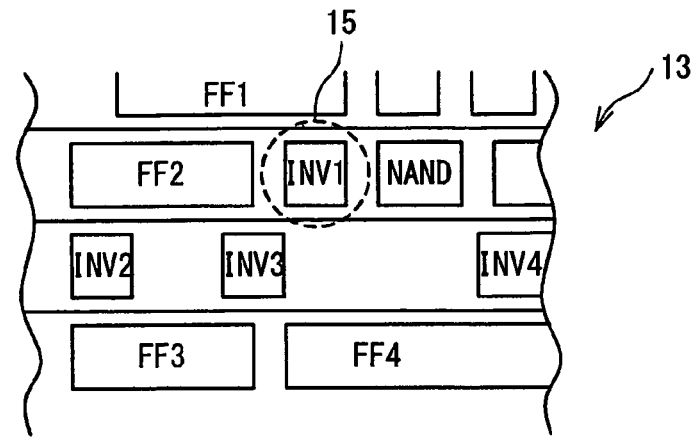
FIG. 13 is a plan view conceptually showing operation of an element moving section of the third embodiment.
Figure 13B:
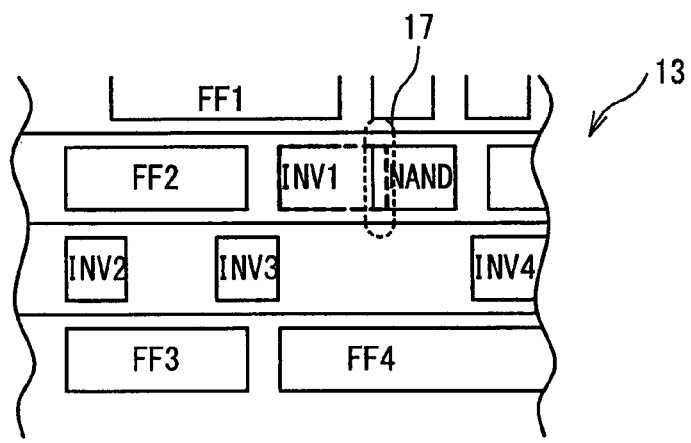
Figure 13C:
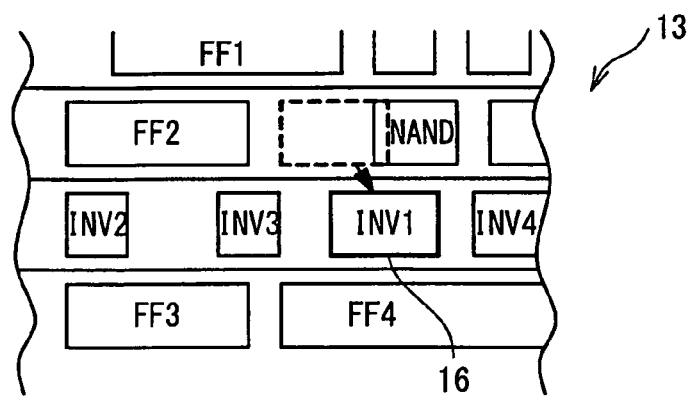

FIGS. 13A, 13B and 13C are plan views conceptually showing the operation of the element moving section 42 in the third embodiment. FIG. 13A shows a state when a substitution target element 15 in an integrated circuit 13 is specified. FIG. 13B shows a state of the integrated circuit 13 when the substitution target element 15 is substituted by the analysis target element 16. FIG. 13C shows a state of the integrated circuit 13 when the analysis target element 16 has been moved.

Referring to FIG. 13B, when a first inverter INV1 is specified as the substitution target element 15 and is substituted by the analysis target element 16, overlap occurs in an overlap area 17. The element moving section 42 looks for an empty area in order to eliminate the overlap area 17. The element moving section 42 moves the analysis target element 16 to the found empty area.

The circuit design supporting apparatus 1 of the third embodiment can eliminate the overlap between elements when the overlap between elements occurs through the element substitution. Thus, a circuit layout can be formed to normally operate.

Further, in the circuit design supporting apparatus 1 of the third embodiment, the element moving section 42 may restore the analysis target element 16 to the substitution target element 15, and arrange it in an original position, if a movement distance of the substitution target element 15 is larger than a predetermined value.

If the movement distance of the analysis movement element 16 is large, an interconnection length may become longer to thereby increase a parasitic capacitance. If the increase in the parasitic capacitance causes an operation speed of the circuit to slow down, a timing violation may occur. If the timing violation occurs, the element moving section 42 arranges the substitution target element 15 in the integrated circuit 13 without substituting the substitution target element 15 by the analysis target element 16.

The operation associated with a determination of whether or not the element moving section 42 restores a substituted element is shown. First, a movement distance of the element is denoted by L, and a parasitic capacitance per unit length of an interconnection line is denoted by $C_{unit}$. In this case, an increase in parasitic capacitance of the interconnection line $C_{WIRE}$ is expressed by the following expression:

$$C_{WIRE} = C_{unit} \times L$$

If a delay variation when the increase in parasitic capacitance $C_{WIRE}$ is added to an input/output net of the substituted element exceeds a timing margin, the processing flow to restore the element to coordinate/element prior to the substitution is performed.

The calculation of the delay variation is the same as the calculation performed in the delay calculating section 36. Also, the calculation of the element movement distance L may use a Manhattan distance besides a linear distance. As the element movement distance is increased, the parasitic capacitance $C_{WIRE}$ increases, which is likely to cause a timing violation. Accordingly, a possibility of performing a cancelling process of the element substitution is also increased. Also, only if the timing violation occurs by the element movement, the cancelling process of the element substitution is performed. For this reason, this is effective as a technique for avoiding the occurrence of the timing violation by the element movement.

In the above, the embodiments of the present invention have been specifically described. The present invention is not limited to any of the above-described embodiments, but can be variously modified without departing from the scope thereof. Also, the plurality of embodiments described above can be performed in combination unless any contradiction occurs in a configuration and the operation of the combined embodiment.

What is claimed is:

1. A circuit design supporting apparatus comprising:
an observation portion specifying section configured to specify a first portion of an integrated circuit as an observation portion, the first portion determined as having an effect on an easiness of a failure analysis of the integrated circuit; and
an element substitution performing section configured to substitute an element arranged in said observation portion with an analysis target element so that a result of the failure analysis by a failure analysis apparatus is improved as based on data derived from said observation portion with said analysis target element,
wherein said element substitution performing section comprises:
a timing analyzing section configured to perform a timing analysis of the integrated circuit shown by a netlist;
a delay calculating section configured to calculate a delay in the integrated circuit based on a result of the timing analysis by said timing analyzing section and said netlist;
a substitution element determining section configured to specify a fine element, which is arranged in said observation portion, of elements of the integrated circuit as a substitution candidate element; and
an element substituting section configured to update said netlist to form a new netlist,
wherein said delay calculating section calculates a delay change, when substituting said element arranged in said observation portion with said analysis target element,
wherein said substitution element determining section is further configured to generate an instruction to said element substituting section to substitute said substitution candidate element with said analysis target element, if said delay change when said substitution candidate element is substituted with said analysis target element is within a preset timing margin, and
wherein said element substituting section substitutes said substitution candidate element with said analysis target element so as to form said new netlist, in response to said instruction from said substitution element determining section.

2. The circuit design supporting apparatus according to claim 1, wherein said substitution element determining section inhibits the substitution of said substitution candidate element to said analysis target element, when said delay change exceeds the preset timing margin.

3. The circuit design supporting apparatus according to claim 2, wherein said substitution element determining section outputs the instruction to said element substituting section so as to substitute said substitution candidate element with said analysis target element, when a plurality of substitution candidate elements are contained in said observation portion, and said delay change when at least one of said plurality of substitution candidate elements is substituted with said analysis target element is within the preset timing margin.

4. The circuit design supporting apparatus according to claim 1, further comprising an element arranging section configured to generate an element layout data based on said netlist,
wherein said timing analyzing section executes the timing analysis of the integrated circuit which is configured based on said netlist and said element layout data.

5. The circuit design supporting apparatus according to claim 1, further comprising an interconnecting section configured to execute an interconnection, and to determine an interconnection layout of the integrated circuit which is configured based on said netlist and said element layout data,
wherein said observation portion specifying section refers to said interconnection layout determined by said interconnecting section, to specify the first portion as said observation portion based on said netlist, said element layout data and said interconnection layout.

6. The circuit design supporting apparatus according to claim 1, wherein said element substitution performing section further comprises a substitution candidate element extracting section,
wherein said substitution candidate element extracting section extracts as a specific substitution candidate element, an element which is present on a path in a setup timing violation, which can be canceled or be reduced by increasing a size of said element, based on a timing violation path data which indicates the path in the setup timing violation outputted from said timing analyzing section and the delay change after the element substitution outputted from said delay calculating section, and supplies the specific substitution candidate element data which contains a list including the extracted specific substitution candidate element to said element substitution determining section, and
wherein said substitution element determining section generates an instruction to said element substituting section so as to substitute said specific substitution candidate element with said analysis target element, if said delay change when said specific substitution candidate element is substituted by said analysis target element is within the preset timing margin.

7. The circuit design supporting apparatus according to claim 1, further comprising an element moving section,
wherein said element moving section moves said analysis target element into a free space, when an element adjacent to said substitution candidate element and said analysis target element overlap.

8. The circuit design supporting apparatus according to claim 7, wherein said element moving section returns said analysis target element to a position of said substitution candidate element before the substitution, when a distance between said analysis target element and said free space exceeds a predetermined value.

9. A circuit design supporting apparatus comprising:
an observation portion specifying section configured to specify a first portion of an integrated circuit as an observation portion, the first portion determined to have an effect on an easiness of a failure analysis of the integrated circuit; and
an element substitution performing section configured to substitute an element arranged in said observation portion with an analysis target element so that a failure analysis apparatus is better able to conduct said failure analysis based on data derived from said observation portion,
wherein said observation portion specifying section extracts equivalent failure groups G1 to GI (I is an integer equal to or more than 1) of failures which failure points cannot be specified in the integrated circuit by external measurement, from a netlist,
wherein a parameter Di (i=1 to I) to said equivalent failure group Gi is defined by Di=JiPi, where a number of nets which are contained in said equivalent failure group Gi is Ji, and a probability that a failure is contained in said equivalent failure group Gi is Pi, and
wherein a summation of said parameters Di is defined as an analysis difficulty degree M, and a decrease rate of said analysis difficulty degree M through an insertion of the observation portion is defined as an analysis easiness improvement effect, and a point where said observation portion is inserted based on the analysis easiness improvement effect is a position of said observation portion.

10. The circuit design supporting apparatus according to claim 9, wherein said observation portion specifying section calculates said probability Pi that the failure is contained in said equivalent failure group Gi, based on at least one of:
a length of an interconnection which is contained in said equivalent failure group Gi;
a distance between an adjacent interconnection that is adjacent to said interconnection;
a length for which said interconnection and said adjacent interconnection are in parallel; and
a number of vias which are contained in said equivalent failure group Gi.

11. A circuit design supporting method comprising:
specifying, by an observation portion specifying section, as executed by a processor on a computer, a first portion of an integrated circuit as an observation portion, the first portion determined as having an effect on an easiness of a failure analysis of the integrated circuit; and
substituting, by an element substitution performing section, an element arranged in said observation portion with an analysis target element so that data derived from said observation portion by a failure analysis apparatus is improved, thereby improving the easiness to conduct said failure analysis of said integrated circuit,
wherein said substituting an element arranged in said observation portion comprises:
performing a timing analysis of the integrated circuit shown by a netlist;
calculating a delay in the integrated circuit based on a result of the timing analysis and said netlist;
specifying a fine element, which is arranged in said observation portion, of elements of the integrated circuit as a substitution candidate element; and
updating said netlist to form a new netlist,
wherein said calculating a delay comprises calculating a delay change, when substituting said element arranged in said observation portion by with said analysis target element,
wherein said specifying a fine element comprises generating an instruction to said element substituting section to substitute said substitution candidate element by with said analysis target element, if said delay change when said substitution candidate element is substituted by said analysis target element is within a preset timing margin, and wherein said updating comprises forming said new netlist by substituting said substitution candidate element with said analysis target element in response to said instruction from said substitution element determining section.

12. The circuit design supporting method according to claim 11, wherein said specifying a fine element further comprises inhibiting the substitution of said substitution candidate element with said analysis target element, when said delay change exceeds the preset timing margin.

13. The circuit design supporting method according to claim 12, wherein said specifying a fine element further comprises generating the instruction to said element substituting section so as to substitute said substitution candidate element with said analysis target element, if a plurality of substitution candidate elements are contained in said observation portion, and if said delay change when at least one of said plurality of substitution candidate elements is substituted with said analysis target element is within the preset timing margin.

14. The circuit design supporting method according to claim 11, further comprising generating an element layout data based on said netlist,
wherein said performing timing analysis comprises executing the timing analysis of the integrated circuit which is configured based on said netlist and said element layout data.

15. The circuit design supporting method according to claim 11, further comprising determining an interconnection layout of the integrated circuit which is configured based on said netlist and element layout data,
wherein said specifying a first portion comprises referring to said determined interconnection layout, to specify the first portion as said observation portion based on said netlist, said element layout data and said interconnection layout.

16. The circuit design supporting method according to claim 11, wherein said substituting an element arranged in said observation portion comprises extracting a the substitution candidate element,
wherein said extracting a the substitution candidate element comprises:
extracting as a specific substitution candidate element, an element which is present on a path in a setup timing violation that can be canceled or be reduced by increasing a size of said element, based on a timing violation path data which indicates the path in the setup timing violation and the delay change after the substitution of the element; and
supplying the specific substitution candidate element data which contains a list of including the extracted specific substitution candidate element to said element substitution determining section, and
wherein said specifying a fine element further comprises generating an instruction to said element substituting section so as to substitute said specific substitution candidate element with said analysis target element, if said delay change when said specific substitution candidate element is substituted by said analysis target element is within the preset timing margin.

17. The circuit design supporting method according to claim 11, further comprising moving said analysis target element into a free space when an element adjacent to said substitution candidate element and said analysis target element overlap.

18. The circuit design supporting method according to claim 17, wherein said moving said analysis target element comprises returning said analysis target element to a position of said substitution candidate element before the substitution, when a distance between said analysis target element and said free space exceeds a predetermined value.

19. A non-transitory computer-readable recording medium in which a computer-executable program code is stored to realize a circuit design supporting method, the computer-executable program code, when executed by a computer, performs the circuit design supporting method comprising:
specifying, by an observation portion specifying section, a first portion of an integrated circuit as an observation portion, the first portion being determined as having an effect on an easiness of a failure analysis of the integrated circuit; and
substituting, by an element substitution performing section, an element arranged in said observation portion with an analysis target element so that data derived from said observation portion by a failure analysis apparatus is improved, thereby improving the easiness to conduct said failure analysis,
wherein said substituting an element arranged in said observation portion comprises:
performing a timing analysis of the integrated circuit shown by a netlist;
calculating a delay in the integrated circuit based on a result of the timing analysis and said netlist;
specifying a fine element, which is arranged in said observation portion, of elements of the integrated circuit as a substitution candidate element; and
updating said netlist to form a new netlist,
wherein said calculating a delay comprises calculating a delay change when substituting said element arranged in said observation portion by said analysis target element,
wherein said specifying a fine element comprises generating an instruction to said element substituting section to substitute said substitution candidate element with said analysis target element, if said delay change when said substitution candidate element is substituted by said analysis target element is within a preset timing margin, and
wherein said updating comprises forming said new netlist by substituting said substitution candidate element with said analysis target element in response to said instruction from said substitution element determining section.

20. The non-transitory computer-readable recording medium according to claim 19, wherein said specifying a fine element further comprises inhibiting the substitution of said substitution candidate element with said analysis target element, when said delay change exceeds the preset timing margin.

21. The non-transitory computer-readable recording medium according to claim 20, wherein said specifying a fine element further comprises generating the instruction to said element substituting section so as to substitute said substitution candidate element with said analysis target element, if a plurality of substitution candidate elements are contained in said observation portion, and if said delay change when at least one of said plurality of substitution candidate elements is substituted to said analysis target element is within the preset timing margin.

22. The non-transitory computer-readable recording medium according to claim 19, wherein said circuit design supporting method further comprises generating an element layout data based on said netlist, and
wherein said performing timing analysis comprises executing the timing analysis of the integrated circuit which is configured based on said netlist and said element layout data.

23. The non-transitory computer-readable recording medium according to claim 19, wherein the circuit design supporting method further comprises determining an interconnection layout of the integrated circuit which is configured based on said netlist and element layout data, and
  wherein said specifying a first portion comprises referring to said determined interconnection layout, to specify the first portion as said observation portion based on said netlist, said element layout data and said interconnection layout.

24. The non-transitory computer-readable recording medium according to claim 19, wherein said substituting an element arranged in said observation portion comprises extracting the substitution candidate element,
  wherein said extracting the substitution candidate element comprises:
    extracting, as a specific substitution candidate element, an element which is present on a path in a setup timing violation that can be canceled or be reduced by increasing a size of said element, based on a timing violation path data which indicates a path in the setup timing violation and the delay change after the substitution of the element; and
    supplying the specific substitution candidate element data which contains a list of including the extracted specific substitution candidate element to said element substitution determining section, and
  wherein said specifying a fine element further comprises the generating of the instruction to said element substituting section so as to substitute said specific substitution candidate element with said analysis target element, if said delay change when said specific substitution candidate element is substituted by said analysis target element is within a preset timing margin.

25. The non-transitory computer-readable recording medium according to claim 19, wherein said circuit design supporting method further comprises moving said analysis target element into a free space when an element adjacent to said substitution candidate element and said analysis target element overlap.

26. The non-transitory computer-readable recording medium according to claim 25, wherein said moving said analysis target element comprises returning said analysis target element to a position of said substitution candidate element before the substitution, when a distance between said analysis target element and said free space exceeds a predetermined value.

* * * * *